(12) United States Patent
Lin et al.

(10) Patent No.: US 9,647,102 B2
(45) Date of Patent: May 9, 2017

(54) FIELD EFFECT TRANSISTOR

(71) Applicants: EPISTAR CORPORATION, Hsinchu (TW); HUGA OPTOTECH INC., Taichung (TW)

(72) Inventors: Heng-Kuang Lin, Taichung (TW); Chien-Kai Tung, Taichung (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 15/065,006

(22) Filed: Mar. 9, 2016

(65) Prior Publication Data

US 2016/0190295 A1 Jun. 30, 2016

Related U.S. Application Data

(63) Continuation of application No. 14/209,024, filed on Mar. 13, 2014, now Pat. No. 9,299,824.

(30) Foreign Application Priority Data

Mar. 14, 2013 (TW) .............................. 102109081 A

(51) Int. Cl.
| H01L 29/778 | (2006.01) |
| H01L 29/20 | (2006.01) |
| H01L 29/205 | (2006.01) |
| H01L 29/22 | (2006.01) |
| H01L 29/267 | (2006.01) |

(52) U.S. Cl.
CPC ...... *H01L 29/7785* (2013.01); *H01L 29/2003* (2013.01); *H01L 29/205* (2013.01); *H01L 29/22* (2013.01); *H01L 29/267* (2013.01); *H01L 29/7783* (2013.01); *H01L 29/7787* (2013.01)

(58) Field of Classification Search
CPC ................................................... H01L 29/7785
See application file for complete search history.

(56) References Cited

U.S. PATENT DOCUMENTS

| 8,125,004 | B2 | 2/2012 | Kaneko |
| 2009/0146182 | A1 | 6/2009 | Hikita |
| 2010/0155720 | A1 | 6/2010 | Kaneko |
| 2011/0266554 | A1 | 11/2011 | Hikita |
| 2014/0264375 | A1* | 9/2014 | Ma ........................ H01L 29/267 257/77 |

FOREIGN PATENT DOCUMENTS

| TW | M298777 | 10/2006 |
| TW | 201242026 A1 | 10/2012 |

* cited by examiner

*Primary Examiner* — Dung Le
(74) *Attorney, Agent, or Firm* — Muncy, Geissler, Olds & Lowe, P.C.

(57) ABSTRACT

A field effect transistor includes a substrate; a first semiconductor layer, disposed over the substrate; a second semiconductor layer, disposed over the first semiconductor layer, wherein an interface between the first semiconductor layer and the second semiconductor layer has a two-dimensional electron gas; a p+ III-V semiconductor layer, disposed over the second semiconductor layer; and a depolarization layer, disposed between the second semiconductor layer and the p+ III-V semiconductor layer, wherein the depolarization layer includes a metal oxide layer.

20 Claims, 6 Drawing Sheets

FIELD EFFECT TRANSISTOR

CROSS-REFERENCE TO RELATED APPLICATION

This application is a continuation of co-pending application Ser. No. 14/209,024, filed on Mar. 13, 2014, for which priority is claimed under 35 U.S.C. §119, and this application claims priority of Application No. 102109081, filed in Taiwan, R.O.C. on Mar. 14, 2013, under 35 U.S.C. §119, the entire contents of all of which are hereby incorporated by reference in their entirety.

BACKGROUND OF THE INVENTION

Field of the Invention

The present application generally relates to a field effect transistor (FET), and more particularly to an FET with a depolarization layer.

Description of Related Art

Recently, III-V material such as gallium nitride (GaN) develops rapidly in the field of the high power devices because it has the piezoelectric effect to generate the two-dimensional electron gas (2DEG) at the junction where the electron mobility and the concentration are very high and the sheet resistance is low. Therefore, it has advantages of high current-density output, low switching loss and high voltage operation.

The operation modes of the GaN-based EFTs comprise normally-on mode (depletion mode) and normally-off mode (enhancement mode), wherein the normally-off GaN-based EFEs are generally E-mode FETs. However, the threshold voltage of the GaN-based E-mode FETs is still lower and may not meet the needs of commercial product application specifications

SUMMARY OF THE INVENTION

A field effect transistor includes a substrate; a first semiconductor layer, disposed over the substrate; a second semiconductor layer, disposed over the first semiconductor layer, wherein an interface between the first semiconductor layer and the second semiconductor layer has a two-dimensional electron gas; a p+ III-V semiconductor layer, disposed over the second semiconductor layer; and a depolarization layer, disposed between the second semiconductor layer and the p+ III-V semiconductor layer, wherein the depolarization layer includes a metal oxide layer.

A field effect transistor, includes a substrate; a first semiconductor layer, disposed over the substrate; a second semiconductor layer, disposed over the first semiconductor layer, wherein an interface between the first semiconductor layer and the second semiconductor layer has a two-dimensional electron gas; a p+ III-V semiconductor layer, disposed over the second semiconductor layer; and a depolarization layer, disposed between the second semiconductor layer and the p+ III-V semiconductor layer, wherein the depolarization layer comprises a II-VI semiconductor layer.

An FET comprises a substrate, a first semiconductor layer disposed over the substrate, a second semiconductor layer disposed over the first semiconductor layer, wherein an interface between the first semiconductor layer and the second semiconductor layer has a two-dimensional electron gas. The E-mode FET further comprises a p+ III-V semiconductor layer disposed over the second semiconductor layer and a depolarization layer disposed between the second semiconductor layer and the p+ III-V semiconductor layer.

Based on the description above, the present application uses a p-type heavily-doped III-V semiconductor layer (p+ III-V semiconductor layer) in association with a depolarization layer made of a high piezoelectric polarization material thereunder to effectively raise a conduction band (Ec) to be higher than the Fermi energy level. In addition, when the depolarization layer of the present application is an intrinsic $Al_xIn_yGa_{1-x-y}N$ layer, the aluminium content of the depolarization layer may be continuously decreased or discontinuously decreased in a direction away from the second semiconductor layer, which may improve that the valence band (Ev) is limited by Fermi level. Hence, regardless of depleting the electrons in the first semiconductor layer by raising Ec or reducing Ev, both ways may effectively advance the threshold voltage of the FET.

DESCRIPTION OF THE EMBODIMENTS

In order to make the features and advantages of the present application more comprehensible, the present application is further described in detail in the following with reference to the embodiments and the accompanying drawings.

The accompanying drawings are included to provide a further understanding the embodiments of the present application, which the present application is not limited thereto and may be implemented through other forms. In the figures, for clarity, the dimensions and the relative dimensions of the layers and the regions may be illustrated exaggeratedly.

Figure 1:
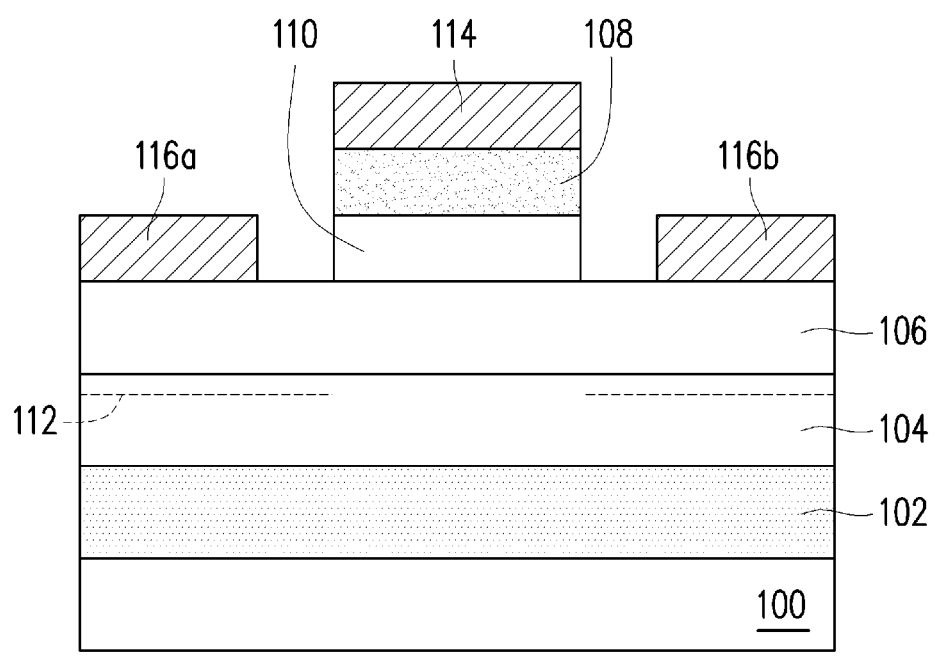
FIG. 1 is a cross-sectional diagram of an FET according to the first embodiment of the present application.

FIG. 1 is a cross-sectional diagram of an FET according to the first embodiment of the present application.

Referring to FIG. 1, an FET in the embodiment includes a substrate 100, a buffer layer 102 over the substrate 100, a first semiconductor layer 104 over the buffer layer 102, a second semiconductor layer 106 over the first semiconductor layer 104 and a p+ III-V semiconductor layer 108 over the second semiconductor layer 106. The substrate 100 may be silicon substrate, sapphire substrate, silicon carbide (SiC) substrate, or gallium nitride (GaN) substrate, for example.

The first semiconductor layer 104 may be an intrinsic GaN layer (i-GaN layer), for example. The second semiconductor layer 106 may be an intrinsic AlGaN layer (i-AlGaN layer), for example. The p+ III-V semiconductor layer 108 may be p+ $Al_xIn_yGa_{1-x-y}N$ layer, wherein 0<x<1 and 0<y<1, for example. The FET in the embodiment further includes a depolarization layer 110 disposed between the second semiconductor layer 106 and the p+ III-V semiconductor layer 108. The depolarization layer 110 is, for example, a ZnO layer, or an intrinsic $Al_xIn_yGa_{1-x-y}N$ layer (i-$Al_{x1}In_yGa_{1-x1-y1}$N layer) with a fixed aluminium content, wherein 0<x<1 and 0<y<1.

Figure 2A:
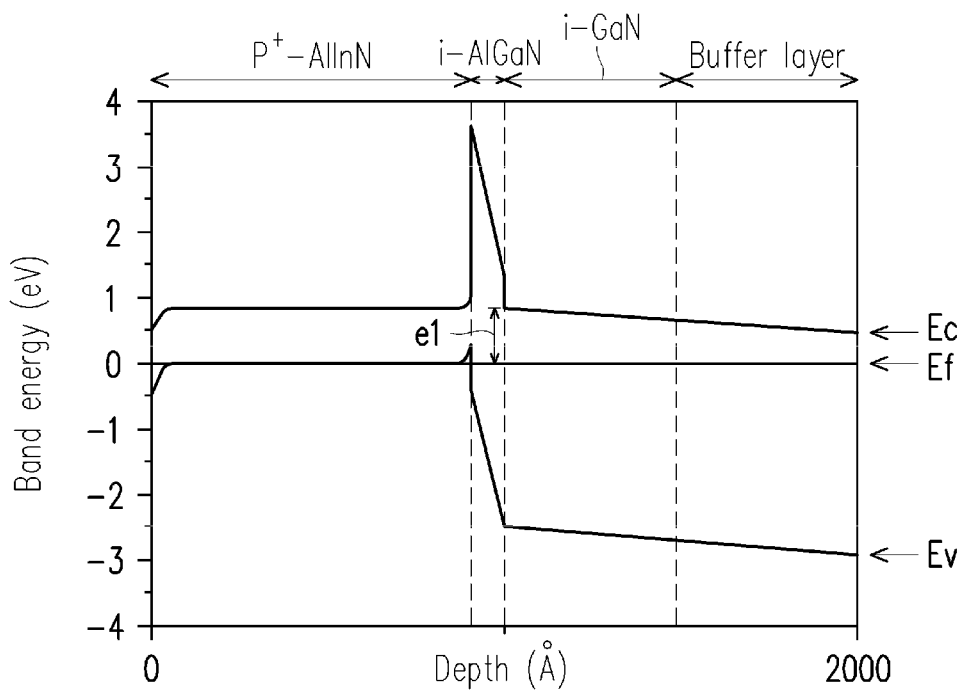
FIG. 2A is a simulation result of an energy band variation curve chart of an FET without the depolarization layer shown in FIG. 1.
Figure 2B:
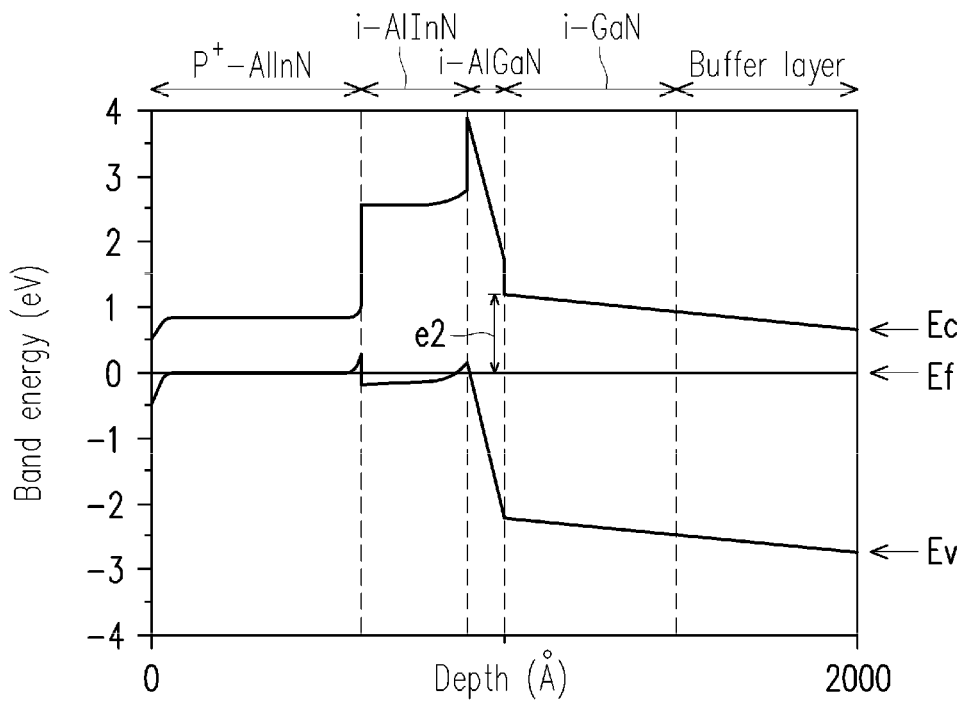
FIG. 2B is a simulation result of an energy band variation curve chart of an FET with the depolarization layer shown in FIG. 1.

The depolarization layer 110 in the FET is capable of raising the conduction band (Ec) to be higher than fermi level (Ef), as shown in FIGS. 2A and 2B. FIG. 2A is an energy band variation curve chart resulted from simulating an FET without the depolarization layer shown in FIG. 1. FIG. 2B is an energy band variation curve chart resulted from simulating an FET with the depolarization layer shown in FIG. 1. Herein, the depolarization layer 110 is intrinsic AlInN, the first semiconductor layer 104 is i-GaN, the second semiconductor layer 106 is i-AlGaN, and the p+ III-V semiconductor layer 108 is p+-AlInN, for example. In comparison with the e1 in FIG. 2A, the e2 in FIG. 2B indicates the Ec of the FET having the depolarization layer 110 is significantly raised (e2>e1).

Further, the FET of FIG. 1 further includes a gate 114 disposed over the p+ III-V semiconductor layer 108, and a source 116a and a drain 116b disposed over the second semiconductor layer 106, while a two-dimensional electron gas (2DEG) 112 is disposed between the first semiconductor layer 104 and the second semiconductor layer 106.

In addition, in the embodiment, since the depolarization layer 110 which made of a high piezoelectric polarization material under the p+ III-V semiconductor layer 108 may create a depolarization electric field, the energy level of the interface between the first semiconductor layer 104 and the second semiconductor layer 106 may be raised. Therefore, the integral energy level of the FET is further improved, and the ability of depressing the 2DEG 112 between the first semiconductor layer 104 and the second semiconductor layer 106 may be enhanced (i.e., to increase the threshold voltage of device) so as to achieve the normally-off operation mode.

Figure 3:
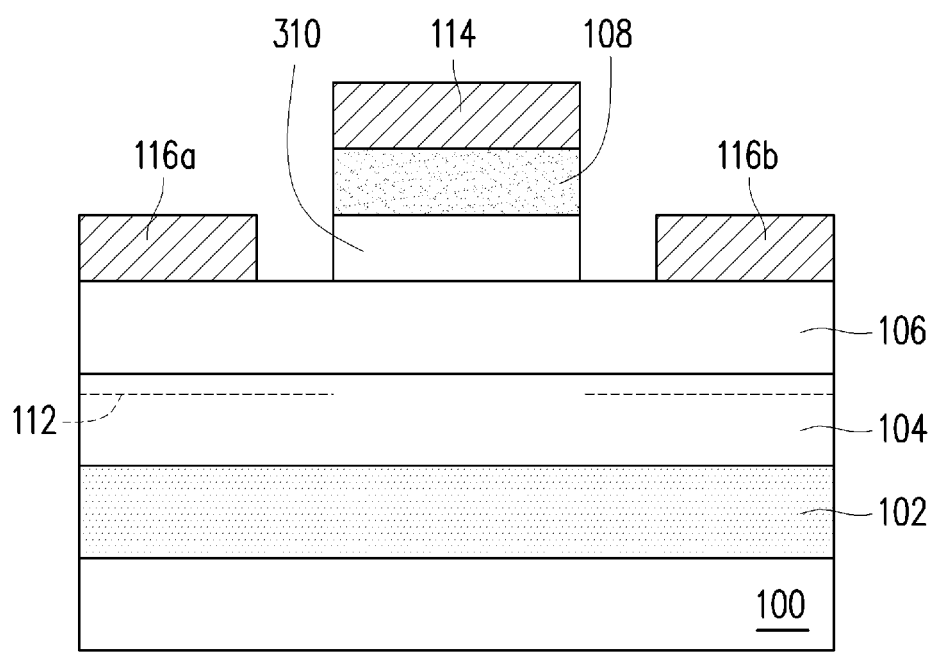
FIG. 3 is a cross-sectional diagram of an FET according to the second embodiment of the present application.

FIG. 3 is a cross-sectional diagram of an FET according to the second embodiment of the present application, wherein the same or the similar parts as/to the ones in the first embodiment (FIG. 1) use the same notations as in FIG. 1.

Referring to FIG. 3, the difference of the FET in the embodiment from that of FIG. 1 rests in when the depolarization layer 310 is an i-$Al_xIn_yGa_{1-x-y}N$ layer (wherein 0<x<1 and 0<y<1), the aluminium content thereof may be continuously decreased or discontinuously decreased in a direction away from the second semiconductor layer, which makes the energy band of the depolarization layer 310 changed, as shown by nine energy band variation curves in FIGS. 4(a)-4(i). The depth of zero herein represents the initial position of the depolarization layer 310 and is the jointing position between the p+-AlInN and i-AlInN, which the embodiment is not limited to.

Figure 4:
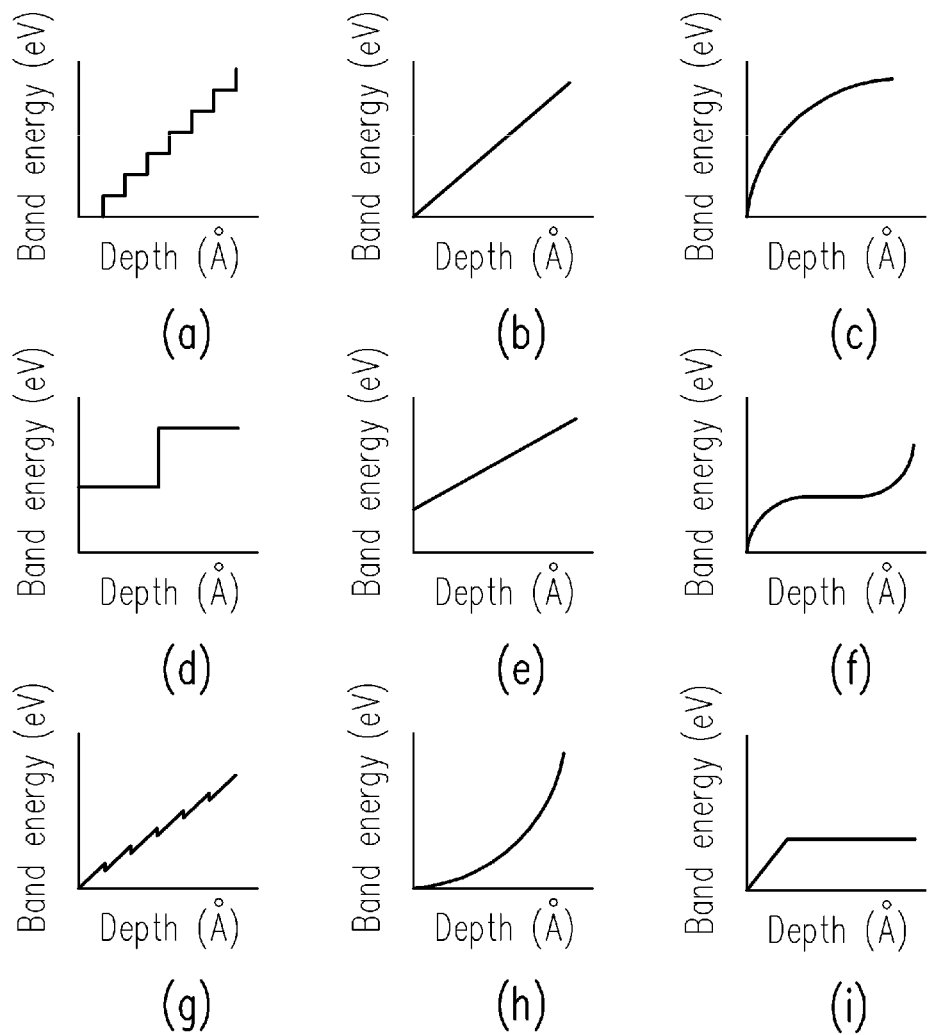
FIG. 4 is a chart showing a plurality of energy band variation curves of the depolarization layer according to the second embodiment of the present application.
Figure 5:
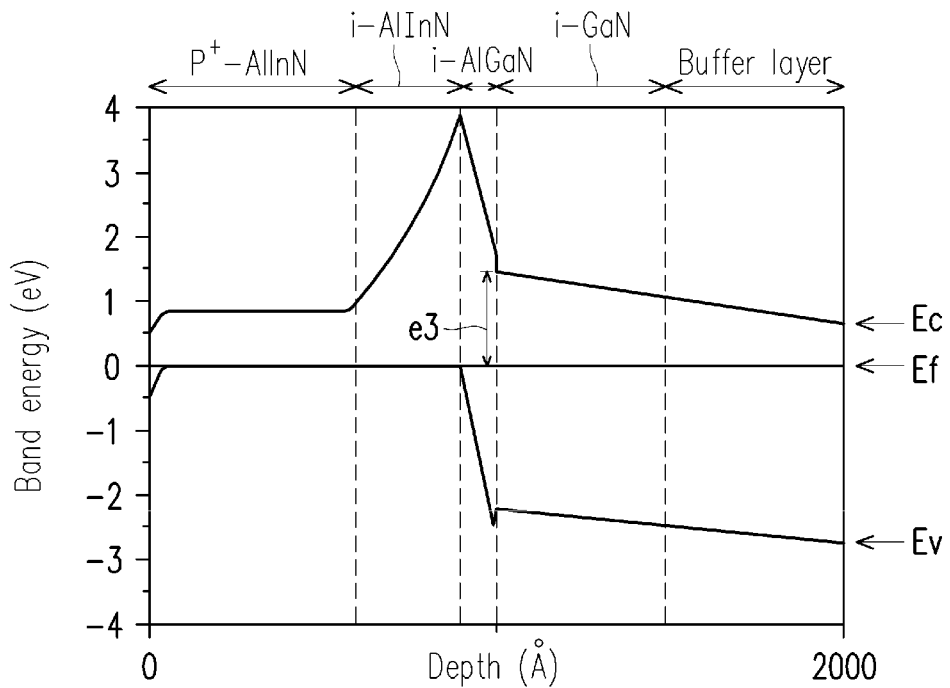
FIG. 5 is an energy band variation curve chart resulted from simulating an FET wherein the aluminum content of the depolarization layer shown in FIG. 3 is continuously decreased in a direction away from the second semiconductor layer.

FIG. 5 is an energy band variation curve chart resulted from simulating an FET in FIG. 3 wherein the aluminum content of the depolarization layer 310 is continuously decreased in a direction away from the second semiconductor layer (as shown in FIG. 4(e)), and the other structures are the same as those in FIG. 2B. It can be seen from FIG. 5 that the energy band of the depolarization layer 310 (i-AlInN) is continuously increased in a direction far away from the gate 114. In comparison with the e1 in FIG. 2A and the e3 in FIG. 5, the Ec of the depolarization layer 310 with continuously decreased aluminium content in a direction away from the second semiconductor layer is also significantly raised (e3>e1).

Figure 6:
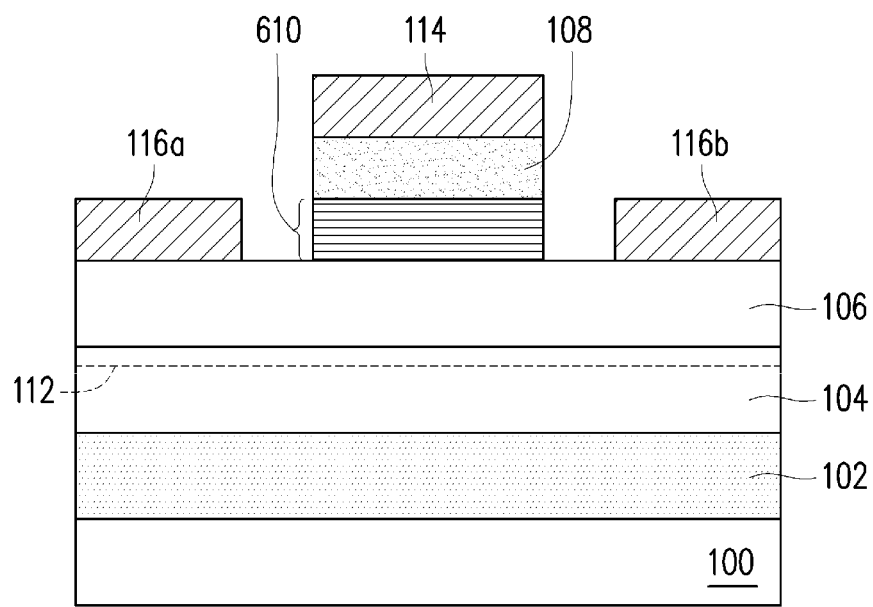
FIG. 6 is a cross-sectional diagram of an FET according to the third embodiment of the present application.

FIG. 6 is a cross-sectional diagram of an FET according to the third embodiment of the present application, wherein the same or the similar parts as/to the ones in the above-mentioned embodiments (FIGS. 1 and 3) use the same notations as in FIGS. 1 and 3.

Referring to FIG. 6, the difference of the FET in the embodiment from that of FIG. 1 rests in the depolarization layer 610 is a superlattice structure, which means two or more layers made of different materials are alternately stacked, and the thickness of each layer is several nanometers (nm). The depolarization layer 610 in the embodiment may be formed by III-V semiconductors with different band gaps, for example, an alternately stacked structure formed by an intrinsic $Al_xIn_yGa_{1-x-y}N$ layer and an intrinsic $In_zGa_{1-z}N$ layer, wherein 0<x<1, 0<y<1, 0<z<1 except for both y and z are 0, or an alternately stacked structure formed by an intrinsic $Al_xIn_yGa_{1-x-y}N$ layer and an intrinsic $Al_{x1}In_{y1}Ga_{1-x1-y1}N$ layer, wherein 0<x<1, 0<y<1, 0<x1<1, 0<y1<1 except for both y and y1 are 0. In addition, the depolarization layer 610 may be formed by II-VI semiconductors with different band gaps, for example, ZnO.

In the second and third embodiments, since the depolarization layers 310 and 610 which made of a high piezoelectric polarization materials under the p+ III-V semiconductor layer 108 may also create depolarization electric fields, the energy levels of the interface between the first semiconductor layer 104 and the second semiconductor layer 106 may be raised. Accordingly, the integral energy level of the FET can be improved, and the ability of depressing the 2DEG 112 between the first semiconductor layer 104 and the second semiconductor layer 106 may be enhanced (i.e., to increase the threshold voltage of device) in order to achieve the normally-off operation mode.

Figure 7:
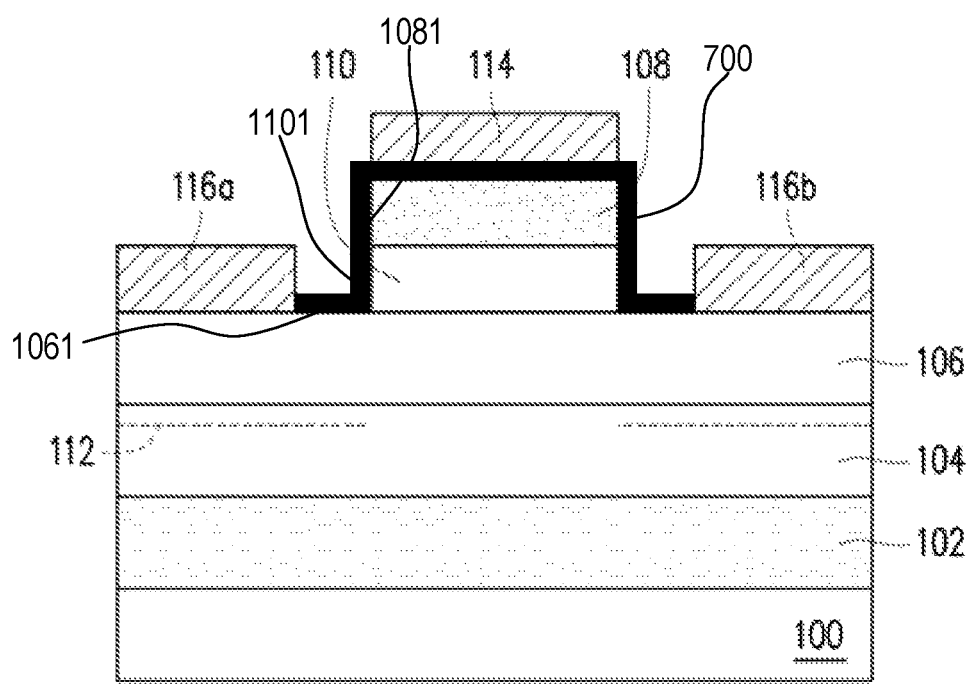
FIG. 7 is a cross-sectional diagram of an FET according to the fourth embodiment of the present application.

FIG. 7 shows a FET in accordance with a fourth embodiment of the present application. The FET of the fourth embodiment is similar to that of the first embodiment, expect that the FET further comprises a dielectric layer 700 disposed on the p+ III-V semiconductor layer 108 and extended to a top surface 1061 of the second semiconductor layer 106 along side surfaces 1081 of the p+ III-V semiconductor layer 108 and side surfaces 1101 of the depolarization layer 110. The dielectric layer 700 comprises SiN, $SiO_2$, or $Al_2O_3$ etc., and is capable of preventing the leakage current of the FET.

In summary, in the present application, by disposing a depolarization layer between the p+ III-V semiconductor layer and the second semiconductor layer, the Ec at the interface between the first semiconductor layer and the second semiconductor layer is advanced. In addition, when the depolarization layer of the present application is an intrinsic $Al_xIn_yGa_{1-x-y}N$ layer, the aluminium content of the depolarization layer can be continuously decreased or discontinuously decreased in a direction away from the second semiconductor layer, and thus the valence band (Ev) limited by Fermi level may be improved. Moreover, according to the present application, the threshold voltage of the FET may be effectively advanced.

It will be apparent to those skilled in the art that the descriptions above are several preferred embodiments of the present application only, which does not limit the implementing range of the present application. Various modifications and variations may be made to the structure of the present application without departing from the scope or spirit of the present application. The claim scope of the present application is defined by the claims hereinafter.

What is claimed is:

1. A field effect transistor, comprising:
a substrate;
a first semiconductor layer, disposed over the substrate;
a second semiconductor layer, disposed over the first semiconductor layer,
wherein an interface between the first semiconductor layer and the second semiconductor layer has a two-dimensional electron gas;
a p+III-V semiconductor layer, disposed over the second semiconductor layer;
a depolarization layer, disposed between the second semiconductor layer and the p+III-V semiconductor layer; and
a dielectric layer disposed over the p⁺III-V semiconductor layer,
wherein the depolarization layer comprises a metal oxide layer.

2. The field effect transistor as claimed in claim 1, further comprising a buffer layer disposed between the substrate and the second semiconductor layer.

3. The field effect transistor as claimed in claim 1, wherein the metal oxide layer comprises an intrinsic metal oxide layer.

4. The field effect transistor as claimed in claim 3, wherein the intrinsic metal oxide layer comprises a ZnO layer.

5. The field effect transistor as claimed on claim 1, wherein the second semiconductor layer comprises a top surface, the depolarization layer comprises a side surface, and the dielectric layer extends to the top surface of the second semiconductor layer along the side surface of the depolarization layer.

6. The field effect transistor as claimed on claim 1, wherein the dielectric layer comprises SiN, $SiO_2$, or $Al_2O_3$.

7. A field effect transistor, comprising:
a substrate;
a first semiconductor layer, disposed over the substrate;
a second semiconductor layer, disposed over the first semiconductor layer, wherein an interface between the first semiconductor layer and the second semiconductor layer has a two-dimensional electron gas;
a p+III-V semiconductor layer, disposed over the second semiconductor layer;
a depolarization layer, disposed between the second semiconductor layer and the p+III-V semiconductor layer; and
a dielectric layer disposed over the p+III-V semiconductor layer,
wherein the depolarization layer comprises a II-VI semiconductor layer.

8. The field effect transistor as claimed in claim 7, further comprising a buffer layer disposed between the substrate and the second semiconductor layer.

9. The field effect transistor as claimed in claim 7, wherein the II-VI semiconductor layer comprises an intrinsic II-VI semiconductor layer.

10. The field effect transistor as claimed on claim 7, wherein the second semiconductor layer comprises a top surface, the depolarization layer comprises a side surface, and the dielectric layer extends to the top surface of the second semiconductor layer along the side surface of the depolarization layer.

11. The field effect transistor as claimed on claim 10, wherein the dielectric layer comprises SiN, $SiO_2$, or $Al_2O_3$.

12. A field effect transistor, comprising:
a substrate;
a first semiconductor layer, disposed over the substrate;
a second semiconductor layer, disposed over the first semiconductor layer,
wherein an interface between the first semiconductor layer and the second semiconductor layer has a two-dimensional electron gas;
a p+III-V semiconductor layer, disposed over the second semiconductor layer, and comprising a side surface;
a depolarization layer, disposed between the second semiconductor layer and the p+III-V semiconductor layer; and
a dielectric layer covering the side surface of the p+III-V semiconductor layer,
wherein the depolarization layer comprises a metal oxide layer or a II-VI semiconductor layer.

13. The field effect transistor as claimed on claim 12, wherein the depolarization layer comprises a side surface, and the dielectric layer extends to cover the side surface of the depolarization layer along the side surface of the p+III-V semiconductor layer.

14. The field effect transistor as claimed on claim 13, wherein the second semiconductor layer comprises a top surface, and the dielectric layer is disposed on the top surface of the second semiconductor layer.

15. The field effect transistor as claimed on claim 12, wherein the dielectric layer comprises SiN, $SiO_2$, or $Al_2O_3$.

16. The field effect transistor as claimed in claim 12, wherein the II-VI semiconductor layer comprises an intrinsic II-VI semiconductor layer.

17. The field effect transistor as claimed in claim 12, wherein the metal oxide layer comprises a ZnO layer.

18. The field effect transistor as claimed in claim 12, further comprising a buffer layer disposed between the substrate and the second semiconductor layer.

19. The field effect transistor as claimed on claim 1, further comprising an electrode, wherein the dielectric layer is disposed between the p+III-V semiconductor layer and the electrode.

20. The field effect transistor as claimed on claim 7, further comprising an electrode, wherein the dielectric layer is disposed between the p+III-V semiconductor layer and the electrode.

* * * * *